United States Patent [19]

Fernandez

[11] Patent Number: 5,373,248
[45] Date of Patent: Dec. 13, 1994

[54] TRANSCONDUCTOR EMPLOYING DIFFERENTIAL PAIR COMPOSITE FIELD EFFECT TRANSISTORS

[75] Inventor: Francisco J. Fernandez, Fogelsville, Pa.

[73] Assignee: AT&T Bell Laboratories, Murray Hill, N.J.

[21] Appl. No.: 74,109

[22] Filed: Jun. 8, 1993

[51] Int. Cl.$^5$ .............................................. H03F 3/45
[52] U.S. Cl. ...................................... 330/253; 330/257
[58] Field of Search ............... 330/253, 257, 258, 260, 330/252

[56] References Cited

U.S. PATENT DOCUMENTS

| | | | |
|---|---|---|---|
| 3,916,333 | 10/1975 | Zuk | 330/260 X |
| 4,599,572 | 7/1986 | Nakayama | 330/257 X |
| 4,647,839 | 3/1987 | Siligoni et al. | 330/252 X |

OTHER PUBLICATIONS

Kwan, et al., "An Adaptive Analog Continuous-Time CMOS Biquadratic Filter" IEEE Journal of Solid-State Circuits, vol. 26, No. 6, Jun. 1991 pp. 859–867.

Primary Examiner—James B. Mullins
Attorney, Agent, or Firm—David L. Smith

[57] ABSTRACT

A transconductor includes first and second differential pair compound transistors coupled between a first reference node and a common node. The compound transistors are commoned to each other at a common node. A single current source is coupled between the common node and a second reference node. In an alternate embodiment, a current turnaround circuit may be used to convert the transconductor to a single ended configuration.

10 Claims, 2 Drawing Sheets

TRANSCONDUCTOR EMPLOYING DIFFERENTIAL PAIR COMPOSITE FIELD EFFECT TRANSISTORS

TECHNICAL FIELD

This invention relates generally to transconductors and particularly to a transconductor providing large open loop gain, wideband width and low distortion, and systems utilizing such circuits.

BACKGROUND OF THE INVENTION

Complex analog integrated circuits typically include circuitry to provide access to some internal analog signals for test purposes. To access internal analog signals, the internal analog signals routed as inputs to a multiplexer that is used to select one of the signals as the input to an analog output buffer. The buffer functions to buffer the external load, such as the test equipment, from the integrated circuit that is not designed to drive an external load.

The prior art has many forms of buffer circuits. One widely used prior art buffer circuit includes a differential source coupled pair of transistors with an output source follower. This circuit provides high gain and large bandwidth but has the shortcoming of limited input voltage swing, particularly in the positive direction. The source follower transistor prevents the input voltage from reaching the positive voltage rail due to the threshold and ON voltage of the source follower transistor. A further shortcoming of this circuit is the necessity to continuously sink a large current required for discharging an external capacitive load. For a rapid discharge, a large current is required. The sink current must also be provided by the source follower transistor when charging the external load. Thus, the source follower consumes large amounts of power.

A circuit that appears to overcome shortcomings of the above-mentioned circuit is disclosed in IEEE Journal of Solid State Circuits, Vol. 26, No. 6, June 1991, pages 859–867, the disclosure of which is hereby incorporated by reference. The circuit is depicted in FIG. 3C of the article and is an operational transconductance amplifier, or basic $g_m$ cell. The article teaches using a composite differential pair transistor with current mirrors to provide the output currents. The circuit has linear characteristics voltage-to-current over a large differential input voltage range. The input voltage signal levels are maintained as large as possible to obviate signal-to-noise ratio problems. The linear output versus input characteristics are obtained without feedback in the circuit. The p-channel devices serve as voltage followers buffering the input voltage across the resistor while the four constant current sources force any change in the resistor current to be directly reflected to the drain currents of transistors M2 and M2' which is mirrored to the output by transistors M3 and M3'.

Linear voltage transfer characteristics are typically obtained by employing linear feedback elements around a very high gain voltage amplifier. For use as a voltage buffer, this circuit has the shortcoming of low voltage-to-current gain which results in limited bandwidth. Wide bandwidth is important because the buffer must have a bandwidth at least as great as the bandwidth of the intermediate signals to prevent attenuation of frequencies in the internal analog signals being presented at the buffer output. Ideally, the gain of the buffer should be unity across the entire frequency range of interest so no attenuation of the intermediate signal occurs. This would assure that the intermediate signal is not distorted by the buffer.

It would be desirable to have a highly linear voltage buffer that would provide a wide bandwidth and consume little power. Such a buffer would have a large transconductance such that it would only require a small differential voltage input to result in a relatively large change in output current, thereby providing low distortion.

SUMMARY OF THE INVENTION

A transconductor includes first and second differential pair compound transistors coupled between a first reference node and a common node. The compound transistors are commoned to each other at the common node. A single current source is coupled between the common node and a second reference node. In an alternate embodiment, a current turnaround circuit may be used to convert the transconductor to a single ended configuration.

Detailed Description

Figure 1:
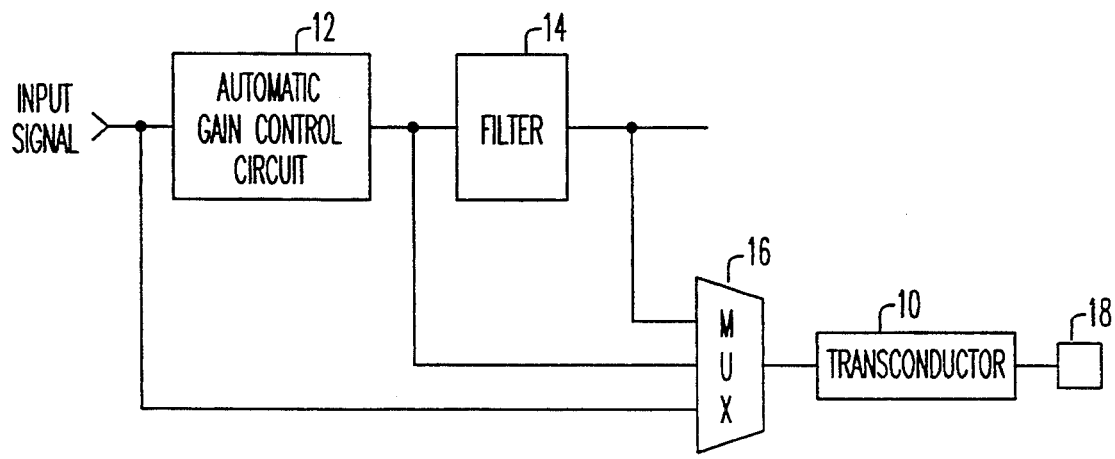
FIG. 1 is a block diagram showing the environment in which an illustrative embodiment of the invention may be used in a unity gain, closed-loop configuration as a voltage output buffer.

An illustrative embodiment of a transconductor 10, in a unity gain feedback configuration, in accordance with the present invention may be used in an integrated circuit to buffer internal analog signals that are coupled to a pad for conduction off chip for test purposes. An exemplary application is shown in FIG. 1 which includes an automatic gain control circuit 12, a filter 14, a multiplexer 16, transconductor 10 configured as a buffer amplifier, and a pad 18. Automatic gain control circuit 12 receives and processes an input signal. Filter 14 receives and filters the output signal from the automatic gain control circuit 14. The filter output is then further processed within the integrated circuit. During testing of the integrated circuit, it may be desirable to provide access to various intermediate signals such as the input and output of the automatic gain control circuit 12 and filter 14. Access to the intermediate signals is achieved by providing the intermediate signals as inputs to a multiplexer 16. Multiplexer 16 is responsive to select inputs (not shown) to selectively pass one of the signals appearing at the input to its output. The output of multiplexer 16 is coupled as the input of transconductor 10. The output of transconductor 10 is coupled to a pad 18 to make the internal analog signal selectively passed by the multiplexer available off chip. Transconductor 10 permits access to the internal analog signal without loading the integrated circuit in a manner not intended.

Figure 2:
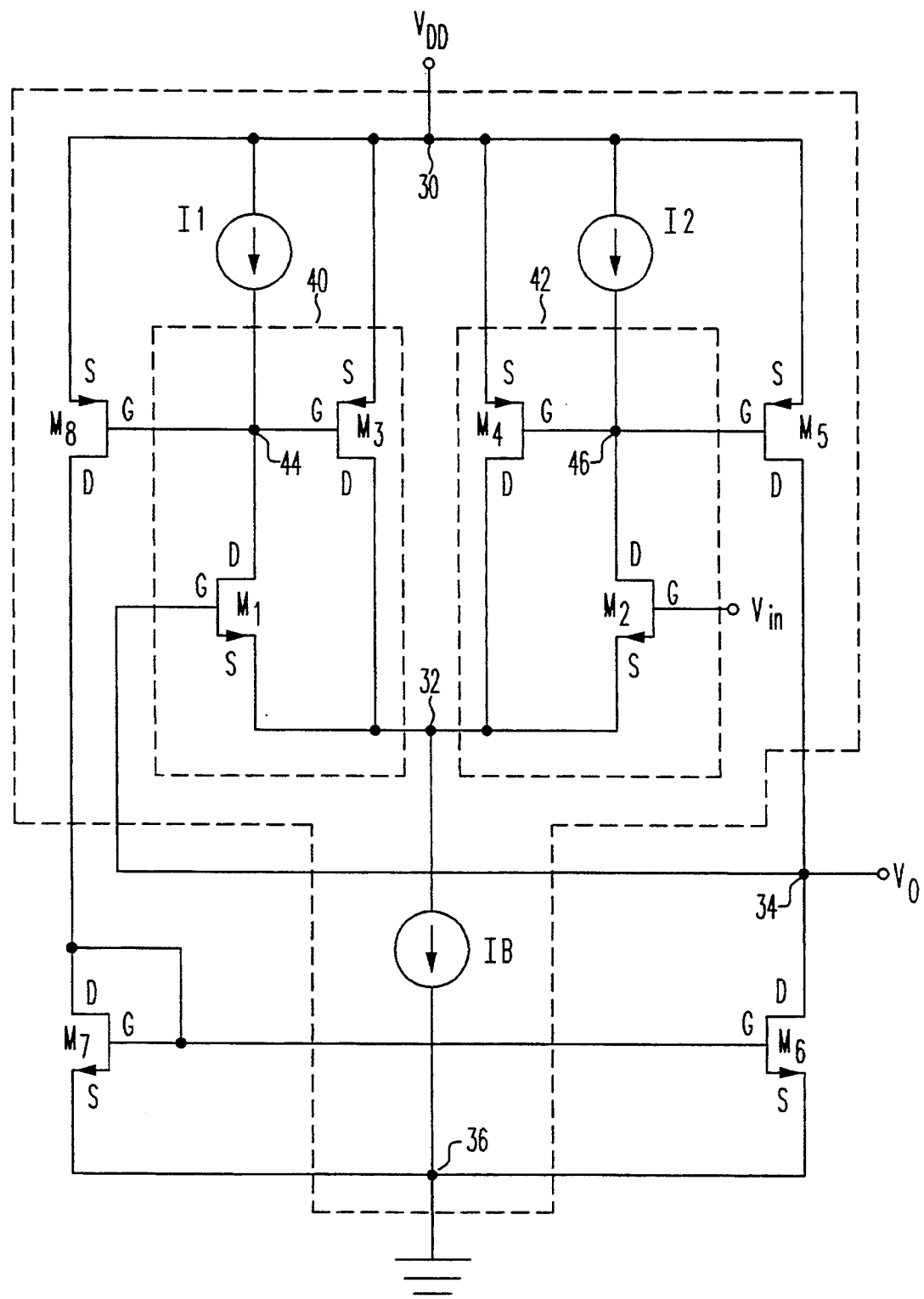
FIG. 2 is a schematic diagram of an illustrative embodiment of a transconductor in accordance with the present invention.

An illustrative embodiment of a transconductor 10 is shown in FIG.2 in which transconductor 10 includes transistors M1, M2, M3, M4, M5 and M8, and current sources I1, I2 and IB. Also shown in FIG. 2 is a current turnaround circuit comprised of transistors M7 and M8.

Transistor M3 has its conduction path coupled between first reference node 30 and node 32. In the illustrated embodiment, first reference node 30 is $V_{DD}$. Transistor M1 has its conduction path coupled between the gate of transistor M3, node 44, and common node 32. The gate of transistor M1 is coupled to output node 34. Transistors M3 and M1 form a first compound transistor 40.

Transistor M8 forms a current mirror with transistor M3. A current mirror is a current amplifier that provides a high impedance output current proportional to an input current. The current through the transistors in the current mirror have a constant ratio, as determined by the width-to-length ratios of the channels of the respective transistors. The gates of transistors M3 and M8 are commoned while the conduction path of transistor M8 is coupled between first reference node 30 and the drain of transistor M7. The conduction path of transistor M7 is coupled between the drain of transistor M8 and second reference node 36. In the illustrated embodiment, second reference node 36 is ground. The drain and gate of transistor M7 are coupled to provide zero bias to the drain-gate junction. A first current source, I1, is coupled between first reference node 30 and node 44 formed at the common gates of transistors M3 and M8.

Transistors M4 and M2 form a second compound transistor 42. Transistor M4 has its conduction path coupled between the first reference node 30 and common node 32. Transistor M2 has its conduction path coupled between the gate of transistor M4, node 46, and common node 32. Transconductor 10 is configured in differential mode and has positive and negative inputs. The gate of transistor M2 receives the positive input to the transconductor and the gate of transistor M1, at node 34, receives the negative input.

Transistor M5 forms a current mirror with transistor M4 with the gates of transistors M4 and M5 commoned at node 46. The conduction path of transistor M5 is coupled between first reference node 30 and output node 34. A second current source, I2, is coupled between first reference node 30 and node 46.

A third current source, IB, is coupled between common node 32 and second reference node 36. The gates of the transistors M6 and M7 are commoned to form a current mirror. The conduction path of transistor M6 is coupled between output node 34 and second reference node 36.

In operation, transconductor 10 is configured as a unity gain voltage amplifier with high output swing, wide bandwidth, low distortion and low power consumption. Transconductor 10 buffers an external load, typically a capacitive load such as test equipment, from the circuit being tested. Differential voltage inputs are provided to the gate electrodes of transistors M1 and M2 which comprise a differential pair of transistors. Transconductor 10 operates on a small differential voltage between the voltage at node 34, $V_{34}$, and the gate voltage of transistor M2, $V_{in}$. The closed loop gain with feedback is unity so the buffer operates to maintain the voltage at the gate of transistor M1, $V_{34}$, equal to the voltage at the gate of transistor M2, $V_{in}$.

A single ended version transconductor 10 is shown in the illustrative embodiment of FIG. 2. At equilibrium, nodes 44 and 46 are maintained at the same voltage level.

When voltage $V_{in}$ increases, the gate-to-source voltage of transistor M2 increases. This causes the voltage at node 46 to decrease and the gate-to-source voltage of transistor M4 as well as the current through transistor M4 to increase. The increased current through transistor M4 increases the voltage at node 32 which decreases the gate-to-source voltage of transistor M1, which increases the voltage at node 44. The voltage at node 46 returns, through the feedback, to the value necessary for the gate-to-source voltage of transistor M2 to cause a current $I_{M2}$ to pass through transistor M2 that is equal to current I2.

The output of transconductor 10 is attained by current mirrored transistor M5 that reflects the current of transistor M4. The current through transistor M5 is proportional to the current through transistor M4 as determined by the width-to-length ratio of the channels of the respective transistors. Normally the channel length of transistor M5 is equal to the channel length of transistor M4 such that the ratio reduces to a function of channel widths.

The other side of transconductor 10 operates in the same manner. The current output of transistor M3 is reflected to current mirror transistor M8. The current passing through transistor M7 is identical to the current passing through M8 and is reflected to current mirror transistor M6 in a turnaround circuit. The current turnaround circuit is used to drive transconductor 10 in a single ended configuration by coupling the drain of transistor M6 to output node 34. Variations in the voltage at output node 34 are enhanced by the turnaround circuit in that voltage increases and decreases are enhanced by the operation of transistors M5 and M6.

The current mirror comprising transistors M7 and M6 convert a sourcing current from transistor M8 to a sinking current. The current selected to be the turnaround current, chosen from the current through transistor M3 (and hence transistor M8) or the current through transistor M4 (and hence transistor M5), depends upon the feedback in transconductor 10. The current turnaround circuit accomplishes a differential-to-single ended conversion that transforms two currents, one through transistor M8, IM8, and the other through transistor M5, IM5, to a single current equal to the difference between the two individual currents IM8 and IM5.

When the voltage at output node 34 increases relative to $V_{in}$, the gate-to-source voltage of transistor M1 increases, causing an increase in the current, IM1, through transistor M1. When current IM1 increases, the voltage at node 44 decreases, thereby increasing the gate-to-source voltage of transistor M3 and causing an increased current, IM3, to flow through transistor M3. As more current flows through transistor M3, more current flows into node 32. Since node 32 is limited to sinking a current IB, the voltage at node 32 increases to a level where the gate-to-source voltage of transistor M1 is reduced. The increase in current IM1 is at the expense of decreased current IM2. Since current IM1 increased, current IM2 must decrease. A decrease in current IM2 causes current I2 to be greater than current IM2, removing the right side of transconductor 10 from equilibrium. The voltage at node 46 will increase, thereby reducing the gate-to-source voltage of transistor M4.

When the drain voltage of transistor M2 increases toward the rail voltage $V_{DD}$, the gate-to-source voltage of transistor M4 decreases, causing a reduction in the current through transistor M4. This in turn reduces the current through transistor M5. Both transistors M2 and M4 are carrying less current than at equilibrium, however, current IB hasn't changed from equilibrium. The reduction of current provided by transistors M2 and M4 is compensated for by transistors M1 and M3.

In an application where feedback results in an amplifier for which unity gain is desired, the input voltage that generates an increase of current through transistor M3 that is reflected in the current mirror through transistor M8, increases the output current. The increased output current raises the voltage at output node 34. Since the voltage at output node 34 is connected to the other input of the differential pair, the voltage at output node 34 will increase to match the voltage $V_{in}$ to restore equilibrium and the current in the two sides of the buffer will be divided equally.

Figure 3:
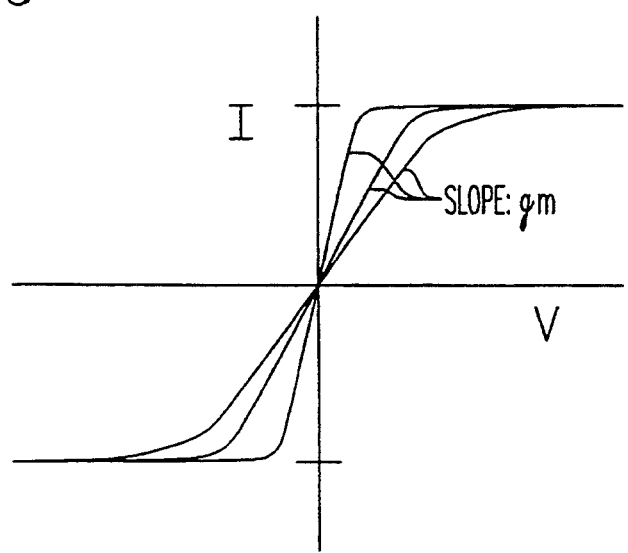
FIG. 3 is a family of curves showing a change in output current for a given change in input voltage as a function of transconductance.

When the voltage tit output node 34 is higher than the voltage $V_{in}$, current I1 is larger than current I2 and the differential current is positive. When the voltage at output node 34 is equal to the voltage at $V_{in}$, transistors M1 and M2 carry the same current, that is current I 1 is equal to current I2. When the voltage at output node 34 is greater than the voltage $V_{in}$, current I2 is larger than current I1 and the difference current is negative. This can be graphed as shown in FIG. 3. The larger the open loop gain of transconductor 10, the steeper the curve between positive and negative saturation in FIG. 3, and the lower the distortion of signals passing through transconductor 10 as the output will more precisely follow the input signal. Thus, it is desirable to operate in the linear region where the difference between the voltage at output node 34 and $V_{in}$ is small.

The open loop voltage-to-current gain of transconductor 10 is a ratio of the output current provided to the load transductor 10 is driving, divided by the differential input voltage. For small signal values, the voltage-to-current gain is the ratio of change in output current to change in input voltage. This is the transconductance, $g_m$ of the transconductor. This is better understood by reference to FIG. 3 which plots current vertically in arbitrary units versus voltage horizontally in arbitrary units for various $g_m$ values.

It is desired to have a very steep linear curve to obtain a large open loop gain. To obtain a large gain, the transconductance $g_m$ must be large as g m is essentially the slope of the curve between positive and negative saturation. The compound transistors 40 and 42 individually have a large transconductance $g_m$. When the compound transistors are commoned at node 32, the transconductance of the resulting circuit is substantially larger resulting in a very steep voltage to current curve. That is, when the source of transistor M1 and the drain of transistor M3 are coupled to the source of transistor M2 and the drain of transistor M4 at node 32, $g_m$ of the resulting circuit is greater than the $g_m$ of the composite transistors 40 or 42. As the transconductance of the circuit increases, the transconductor, configured as a voltage amplifier, must be able to operate on small differences between input voltages at $V_{in}$ and node 34. These voltages can vary over a large range but the voltage difference, which is the input to the buffer, will be maintained small through the feedback operation of transconductor 10 described above, to maintain the differential voltage small.

In the illustrated embodiment shown in FIG. 2, transistors M3, M4, M5 and M8 are shown as p-channel devices, whereas transistors M1, M2, M6 and M7 are shown as n-channel devices. It is understood that a circuit with n-channel devices and p-channel devices reversed from the illustrative embodiment, and also with power supply reference voltages and current sources reversed, would provide the same function.

The invention is particularly useful in analog systems employing integrated circuits including this technique. Such analog systems have the advantage of providing selective access to internal analog signals for test purposes.

I claim:

1. A transconductor, comprising:

first and second differential pair composite transistors, each of said first and second composite transistors having a first transistor with a conduction path coupled between a first reference node and a common node, and a second transistor having a conduction path coupled between a gate electrode of the first transistor and the common node;

a first current source coupled between the first reference node and the gate electrode of the first transistor of the first differential pair composite transistors;

a first current mirror transistor, the first current mirror transistor coupled to the first reference node and the gate electrode of the first transistor in the first differential pair of transistors to reflect the current passing through the first transistor in the first differential pair of transistors;

a second current source coupled between the first reference node and the gate electrode of the first transistor of the second differential pair composite transistors;

a second current mirror transistor, the second current mirror transistor coupled to the first reference node and the gate electrode of the first transistor in the second differential pair of transistors to reflect the current passing through the first transistor in the second differential pair of transistors; and a third current source, the third current source coupled between the common node and a second reference node, whereby the common node couples the first and second differential pair composite transistors without any impedance therebetween.

2. A transconductor as recited in claim 1, wherein the second reference node is ground.

3. A transconductor as recited in claim 1, wherein the third current source is the only current source coupled between the first and second differential pair composite transistors and the second reference node.

4. A transconductor as recited in claim 1, further comprising:

a third current mirror having first and second transistors, the first transistor of the third current mirror having a conduction path coupled between the second current mirror transistor and the second reference node, the second transistor of the third current mirror having a conduction path coupled between an electrode of the first current mirror transistor defining an output node and the second reference node, the second transistor of the third current mirror also having a gate electrode coupled to a gate electrode of the first transistor of the third current mirror, the second transistor of one of the first and second differential pair composite transistors having a gate electrode coupled to the output node, whereby the output from the transconductor can be taken from the output node.

5. A transconductor as recited in claim 4, wherein the transistor of the first and second differential pair composite transistors having a gate electrode coupled to the output node is the second transistor of the second differential pair composite transistor.

6. A system including an integrated circuit, comprising:
first and second differential pair composite transistors, each of said first and second composite transistors having a first transistor with a conduction path coupled between a first reference node and a common node, and a second transistor having a conduction path coupled between a gate electrode of the first transistor and the common node;
a first current source coupled between the first reference node and the gate electrode of the first transistor of the first differential pair composite transistors;
a first current mirror transistor, the first current mirror transistor coupled to the first reference node and the gate electrode of the first transistor in the first differential pair of transistors to reflect the current passing through the first transistor in the first differential pair of transistors;
a second current source coupled between the first reference node and the gate electrode of the first transistor of the second differential pair composite transistors;
a second current mirror transistor, the second current mirror transistor coupled to the first reference node and the gate electrode of the first transistor in the second differential pair of transistors to reflect the current passing through the first transistor in the second differential pair of transistors; and
a third current source, the third current source coupled between the common node and a second reference node, whereby the common node couples the first and second differential pair composite transistors without any impedance therebetween.

7. A system as recited in claim 1, wherein the second reference node is ground.

8. A system as recited in claim 1, wherein the third current source is the only current source coupled between the first and second differential pair composite transistors and the second reference node.

9. A system as recited in claim 1, further comprising:
a third current mirror having first and second transistors, the first transistor of the third current mirror having a conduction path coupled between the second current mirror transistor and the second reference node, the second transistor of the third current mirror having a conduction path coupled between an electrode of the first current mirror transistor defining an output node and the second reference node, the second transistor of the third current mirror also having a gate electrode coupled to a gate electrode of the first transistor of the third current mirror, the second transistor of one of the first and second differential pair composite transistors having a gate electrode coupled to the output node, whereby the output from the transconductor can be taken from the output node.

10. A system as recited in claim 9, wherein the transistor of the first and second differential pair composite transistors having a gate electrode coupled to the output node is the second transistor of the second differential pair composite transistor.

* * * * *